United States Patent [19]

Nakaya et al.

[11] Patent Number: 5,841,949
[45] Date of Patent: Nov. 24, 1998

[54] LEARNING/INFERENCE METHOD FOR ARTIFICIAL INTELLIGENCE AND APPARATUS THEREFOR

[75] Inventors: Jun Nakaya; Takemi Chikahisa, both of Sapporo, Japan

[73] Assignee: Addin Research Inc., Sapporo, Japan

[21] Appl. No.: 274,802

[22] Filed: Jul. 14, 1994

[30] Foreign Application Priority Data

Jul. 15, 1993 [JP] Japan ................................. 5-196734

[51] Int. Cl.⁶ ................................................. G06F 15/18
[52] U.S. Cl. .............................. 395/77; 395/3; 395/50; 395/61
[58] Field of Search ............................. 395/11, 61, 21, 395/23, 20, 3, 50, 900, 77

[56] References Cited

U.S. PATENT DOCUMENTS 5,249,257  9/1993  Akahori et al. ............................. 395/3

OTHER PUBLICATIONS

Powell, M.J.D. "Radial Basis Functions for Multivariable Interpolation: A Review." Algorithnms for Approximations. J.C.Mason and M.G. Cox, eds. Oxford University Press, Oct. 1985.

Freund, Rudolf J., and William J. Wilson. "Statistical Methods." Academic Press, Jan. 1993.

Kuo, R.J., P.H. Cohen, and S.R.T. Kumara. "Neural Network Driven Fuzzy Inference System." Nueral Networks, 1994 International Conference.

Moody, John and Christian J. Darken. "Fast Learning in Networks of Locally–Tuned Processing Units" Neural Computation. pp. 117–123, Oct. 1988.

*Primary Examiner*—Tariq R. Hafiz
*Attorney, Agent, or Firm*—Armstrong, Westerman, Hattori, McLeland & Naughton

[57] ABSTRACT

Provided is a learning method for artificial intelligence which includes a first step of dividing a multidimensional curved surface constituted by fact data into a plurality of regions; and a second step of generating wiring functions of the respective divisional regions, and storing the wiring functions as a knowledge base. In order to carry out the above method, provided is a learning apparatus for artificial intelligence which includes a fact data storage device for storing fact data; a region dividing device for dividing, into a plurality of regions, a multidimensional curved surface composed by the data stored in the fact data storage device; a regional space wiring function generating device for generating wiring functions of the respective divisional regions divided by the region dividing device; and a wiring function data base for storing the generated wiring functions as a knowledge base.

10 Claims, 14 Drawing Sheets

LEARNING/INFERENCE METHOD FOR ARTIFICIAL INTELLIGENCE AND APPARATUS THEREFOR

BACKGROUND OF THE INVENTION

1. Field of the Invention

The present invention relates to a learning/inference method for artificial intelligence, and to an apparatus for carrying out this method. The method ans apparatus are suitable for use in organically associating all types of data in all fields, especially complex phenomena such as combustion phenomena, predicting results relative to specified input conditions, and analyzing the physical cause-and-effect relations of the phenomena.

2. Description of the Related Art

Combustion phenomena are extremely complex 3-dimensional phenomena which are accompanied by chemical reaction and material diffusion. As a result, conventionally, the only way to conduct analysis of combustion phenomena has been to separately calculate by human labor the various types of combustion data according to assorted individual items, and to statistically analyze these calculations. An analytic method capable of organically associating the various types of combustion data and predicting combustion relative to specified conditions has not yet been realized.

In general, data expressing not so uncomplicated phenomena is put into data base format, and the learning/inference functions possessed by artificial intelligence are used to predict results relative to specified input conditions based on this data. However, artificial intelligence suited to nonlinear, and complicated phenomena such as analysis of combustion phenomena is not available.

A study has been made as to the fuzzy neural network method which is one of the conventional types of artificial intelligence, and which seems to hold the most possibility for the analysis of complicated phenomena.

That is, in combustion analysis, it is necessary to detect correlations relative to nonlinear multivariates. Thus, in order to conduct learning and inference of the correlations from the data of nonlinear multivariates, a fuzzy neural network was adopted from among conventional artificial intelligences because it seems to be the most responsive, and a study was conducted as to its learning performance.

The basic structure of this artificial intelligence is configured by a neural network consisting of one layer which is a monotone of fuzzy filter synapses and which uses the weight of a nonlinear membership function. Compared to previous neural networks, it is characterized by having high learning speed and focusing capability relative to more complicated and vaguer problems, and by being able to learn other inputs and other outputs (K. Nakamura and 2 others, Proceedings of 2nd International Conference on Fuzzy Logic and Neural Networks, pp. 127–130, 1992).

Inference conducts region division of multivariable space, and fuzzily judges to which region it belongs. First, it is necessary to set several functions in order to evaluate the basic characteristics of this conventional artificial intelligence, and after learning in advance several combinations of inputs and outputs which are correct solutions, output values are inferred relative to given input values, and compared with the correct solutions. At this time, in addition to changing the variables in the functions from 1 to a plurality, the influence of the learning frequency was also studied. FIGS. 13A and 13B and FIGS. 14A and 14B show examples of the results. These figures show the number of learned data, and the frequency (number of times the identical data are learned). From FIGS. 13A and 13B, it can be seen that in the case where the number of times of learning is small even relative to simple linear relations, the degree of correctness is not high, and from FIGS. 14A and 14B, it can be seen that with regard to nonlinear functions, it is not at a level which can be accepted for inferential accuracy. In the case where the number of learned data which are retained is a large quantity, it would seem that the representation of nonlinear space becomes possible to a certain degree by means of the region dividing function, but it is clear from the above results that a satisfactory region division cannot be conducted with a quantity of data which is limited in practice.

Next, as a practical example, experimental data which was measured in an actual engine was prepared, and learning and inference (prediction of engine performance) was conducted by the above-mentioned conventional artificial intelligence. With regard to the employed experimental data, as shown in Table 1, it includes not only basic driving conditions such as engine rotational speed, load, and the like, but also injection system data and combustion chamber shape. Fuel consumption, exhaust smoke, and NOx amount were given in the output. By learning these, it was attempted to learn and predict the fuel consumption amount and exhaust performance under optional driving conditions when changes are made in the injection system data and piston shape.

TABLE 1

| Input parameters | • combustion chamber shape<br>• swirl ratio<br>• No. of injection nozzle holes<br>• engine rotational speed<br>• net brake mean effective pressure |
|---|---|
| Output parameters | • net specific fuel consumption rate<br>• NOx generation amount<br>• smoke generation amount<br>• maximum value of heat generation rate |

FIGS. 14A and 14B show examples of the study results, with the inference values on the horizontal axis and the correct solutions on the vertical axis, respectively. In this case, a part or the entirety of the data was learned, after which inference of the learned points or the remaining unlearned points was conducted. With regard to the results, as shown in the figures, the inferential accuracy was extremely poor in either case, and satisfactory performance prediction could not be conducted with the simple use of existing artificial intelligence.

From the above results, it is clear that the conventional fuzzy neural network method requires a large quantity of data in order to conduct inference of nonlinear functions composed from multivariates, and that it is inadequate for purposes of analyzing combustion phenomena which are based on an ordinary small amount of experimental data.

As is clear from the above considerations, by simply applying only the conventional artificial intelligence technology to combustion phenomena which are nonlinear and complex phenomena, it is difficult to conduct practical analysis and prediction of results. This is not limited to combustion phenomena, but also applies to phenomena which are similarly represented by nonlinear multidimensional space.

Thus, the object of the present invention is to provide a learning/inference method for artificial intelligence and an apparatus which are suitable to analyzing and predicting nonlinear and complex phenomena, and which are capable of conducting efficient learning and accurate prediction.

A further object of the present invention is to offer a learning/inference method for artificial intelligence and an apparatus which are able to analyze a nonlinear multidimensional space such as combustion phenomena with a small learning frequency.

SUMMARY OF THE INVENTION

In order to attain the above objects, according to an aspect of the present invention, a learning method for artificial intelligence comprises: a first step of dividing a multidimensional curved surface constituted by fact data into a plurality of regions (12 in FIG. 1); and a second step of generating wiring functions of the respective divisional regions, and storing the wiring functions as a knowledge base (13 in FIG. 1).

Preferably, the second step includes a step of selecting a wiring object plane containing one input parameter component as an object point in one selected region, and generating a wiring function by projecting data of other input parameters.

Preferebly, the projection matches input parameters other than the object plane containing the object point in a multidimensional space by connecting opposite points with regard to neighboring and object planes.

According to another aspect of the present invention, a learning/inference method for artificial intelligence comprises: a first step of dividing a multidimensional curved surface constituted by fact data into a plurality of regions (12 in FIG. 1); a second step of generating wiring functions of the respective divisional regions, and storing the wiring functions as a knowledge base (13 in FIG. 1); and a third step for executing inference by conducting position prediction computation of a space interior using the stored wiring functions (15 in FIG. 1).

According to a further aspect of the present invention, a learning apparatus for artificial intelligence comprises: a fact data storage means for storing fact data (11 in FIG. 1); a region dividing means for dividing, into a plurality of regions, a multidimensional curved surface composed by the data stored in the fact data storage means (12 in FIG. 1); a regional space wiring function generating means for generating wiring functions of the respective divisional regions divided by the region dividing means (13 in FIG. 1); and a wiring function data base for storing the generated wiring functions as a knowledge base (14 in FIG. 1).

According to a still further aspect of the present invention, a learning/inference apparatus for artificial intelligence comprises: a fact data storage means for storing fact data (11 in FIG. 1); a region dividing means for dividing, into a plurality of regions, a multidimensional curved surface composed by the data stored in the fact data storage means (12 in FIG. 1); a regional space wiring function generating means for generating wiring functions of the respective divisional regions divided by the region dividing means (13 in FIG. 1); a wiring function data base for storing the generated wiring functions as a knowledge base (14 in FIG. 1); and an inference means for conducting in-space position prediction computation by using the stored wiring function data base (15 in FIG. 1).

According to the present invention, learning is carried out on the basis of fact data which is observed data of an event represented by a plurality of input parameters and a plurality of output parameters such as those shown in Table 1. The fact data treated by the present invention is nonlinear and includes numerous parameters. First, since the fact data forms a curved surface of a multidimensional space, the curved surface is divided into regions (patches) of small flat tiles. Wiring functions of the respective divisional regions are then generated. When generating a wiring function, a wiring object plane which includes one input parameter component as an object point is selected. The other input parameter data is projected onto the wiring object plane, and the obtained data is stored in the data base as the wiring function. Thus, by being configured to generate and store wiring functions for purposes of representing nonlinear multivariate relations, according to the present invention, it is possible to properly represent, with small quantities of data, the phenomena which have nonlinear relations composed by multivariables. Consequently, it is possible to construct a data base for use in inference from a small quantity of learning data. With regard to the third step which conducts inference or execution of the inference means, inference is conducted by making use of the wiring functions generated by learning. That is, a group of input parameters (conditions) for which predict results are desired are provided; a plurality of wiring functions which approximate these conditions are extracted; and the values of the respective functions are integrated to yield a prediction value. By this means, it is possible to rapidly conduct a highly accurate inference which was not able to be realized with the conventional artificial intelligence.

DESCRIPTION OF THE PREFERRED EMBODIMENTS

Figure 6:
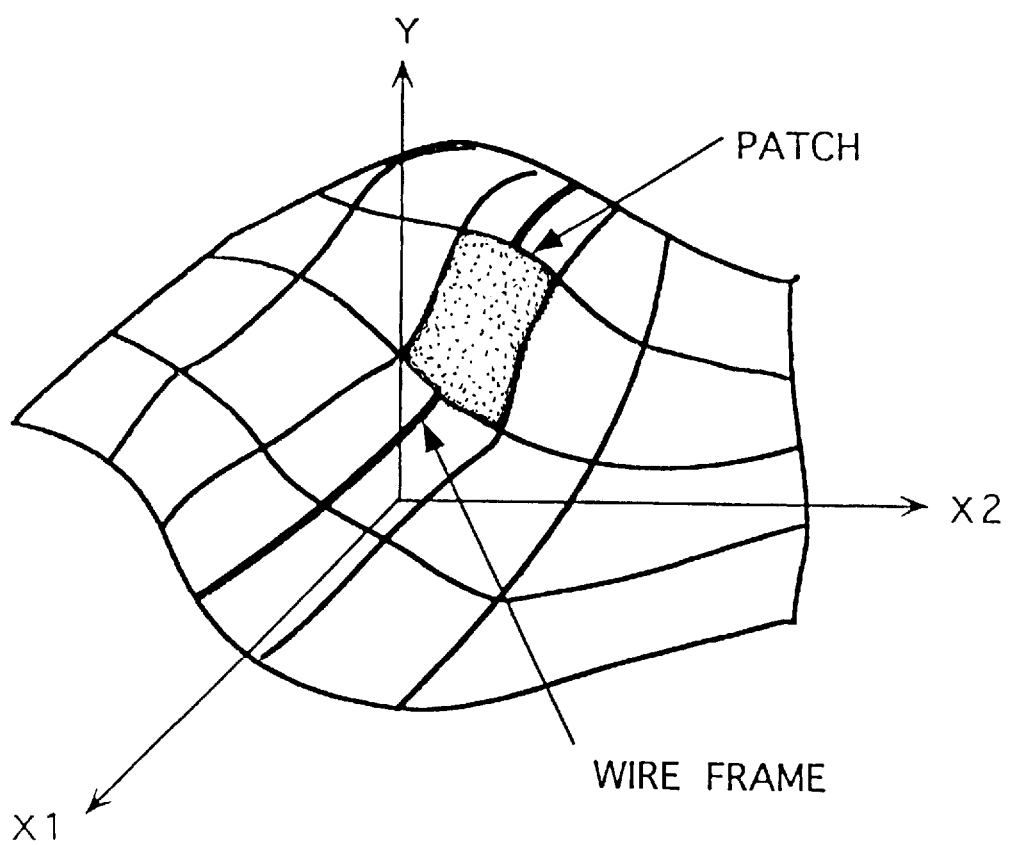
FIG. 6 is a drawing which shows an example of a multidimensional curved surface.

Physical phenomena can be grasped as a multidimensional space wherein the conditions representing the circumstances of the phenomenon (that is, input conditions, experimental conditions, or input parameters) and the results generated by these circumstances (experimental results and output parameters) are put on axes of coordinates. This is referred to as an experimental space. Normally, since it is usual that the data of one result is determined correspondingly to the data of the conditions of a certain event, the set of observed points which can be placed in the space of this event becomes a curved surface inside a multidimensional space, so that it becomes possible to grasp this event as a graphic form. FIG. 6 shows an example of a multidimensional space, and shows a 3-dimensional experimental space consisting of a total of three axes where the experimental conditions constitute two axes (X1 axis and X2 axis), and the experimental results constitute one axis (Y axis). In this experimental space, the experimental point for a certain one occasion is plotted as 1 point which has the respective coordinate components. Accordingly, when many experimental points are plotted, they form a certain curved surface in the experimental space. The curved surface in this case is 3-dimensional, but if an experimental space is practically represented, since it becomes a super high dimensional space of 10 dimensions or 20 dimensions in contrast to FIG. 6, it is difficult to represent the entirety of the curved surface as is with current mathematics. That is, as a method for representing this curved surface, there is multidimensional regression, but in reality this is limited to 3 dimensions, and there does not exist a method of mathematical representation which is able to represent any curved surface of higher dimensions than that. Multivariate analysis, which is a statistical method, is currently being applied to linear relations, and has not developed to the stage of application to nonlinear relations.

The present embodiment applies an innovation to the method which represents a multidimensional curved surface composed from numerous parameters, and conducts representation by dividing the multidimensional curved surface. The divisional representation is expressed by a cross-sectional form referred to as a wire frame. However, since this wire frame is also a multidimensional nonlinear cross section, it is difficult to express it mathematically without alteration. Thus, as shown in FIG. 6, the wire frame undergoes divisional representation by a still smaller multidimensional patch, and a cross-sectional form is represented from various directions in the interior of the patch. The multidimensional patch results from the divisional representation of the curved surface of a multidimensional space by regions of small, flat tiles (patches) in the manner of a soccer ball relative to a 3-dimensional curved surface, and cross sections can be linearly represented in its interior.

Figure 7A:
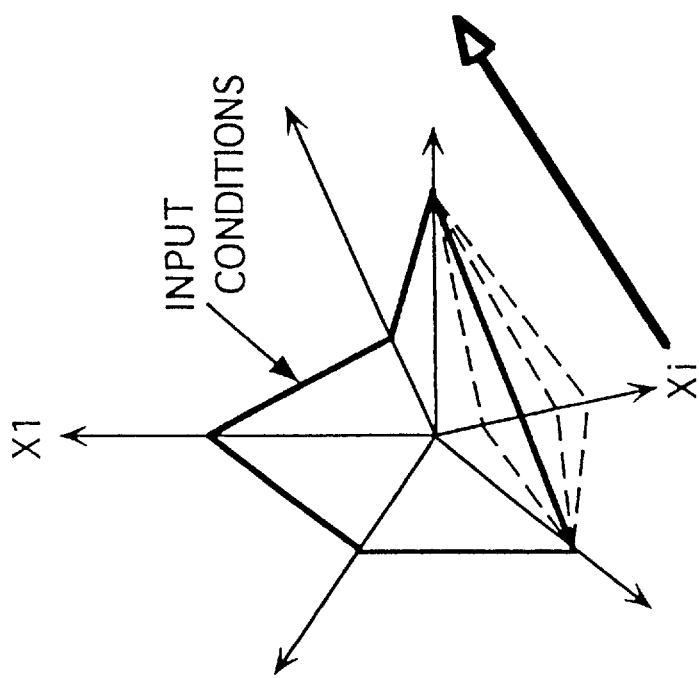
FIGS. 7A and 7B are drawings for purposes of explaining the generation of wiring functions.
Figure 7B:
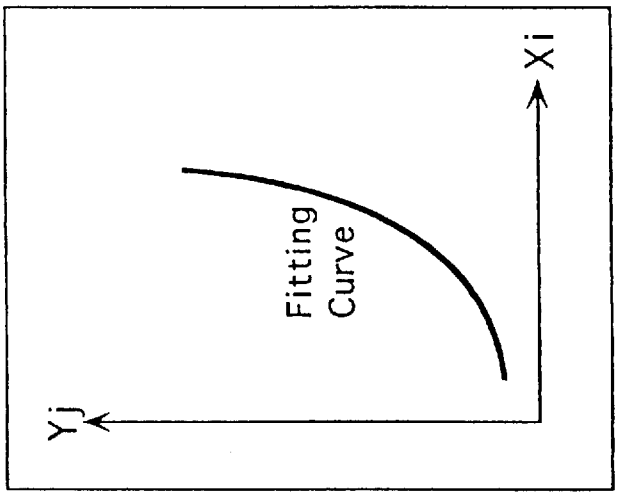

Specifically, for each divisional region, the present embodiment obtains a curve which is formed by a cross section which keeps constant all parameters other than the one parameter which is the projected variable among the input variables (that is, a cross section which is cut by an output parameter corresponding to the one parameter), and makes this the wire frame which forms the curved surface. This method may also be termed a multidimensional CAD. As the final cross-sectional form, the 2-dimensional curve relation of the represented one variable and output is subjected to functional regression, put into data base format, and learned. FIGS. 7A and 7B show one method for generating the wire frame; each one of the radial coordinates corresponds to one parameter of the experimental conditions. The enclosed figure which is shown by the thick line illustrates the experimental conditions at one certain point. The output value exists corresponding to this enclosed figure shown by the thick line. The broken lines of the drawing show the projection shadows at the time when neighboring points are projected onto the Xi–Yj planes of this point. Other conditions of the X axis are projected in conformity with the conditions of this point. That is, the projection shadow when one variable at a time is made a fixed value on this radial coordinate system is linearly obtained from the two neighboring points, and the degree of the variables is sequentially lowered by the same method.

Figure 1:
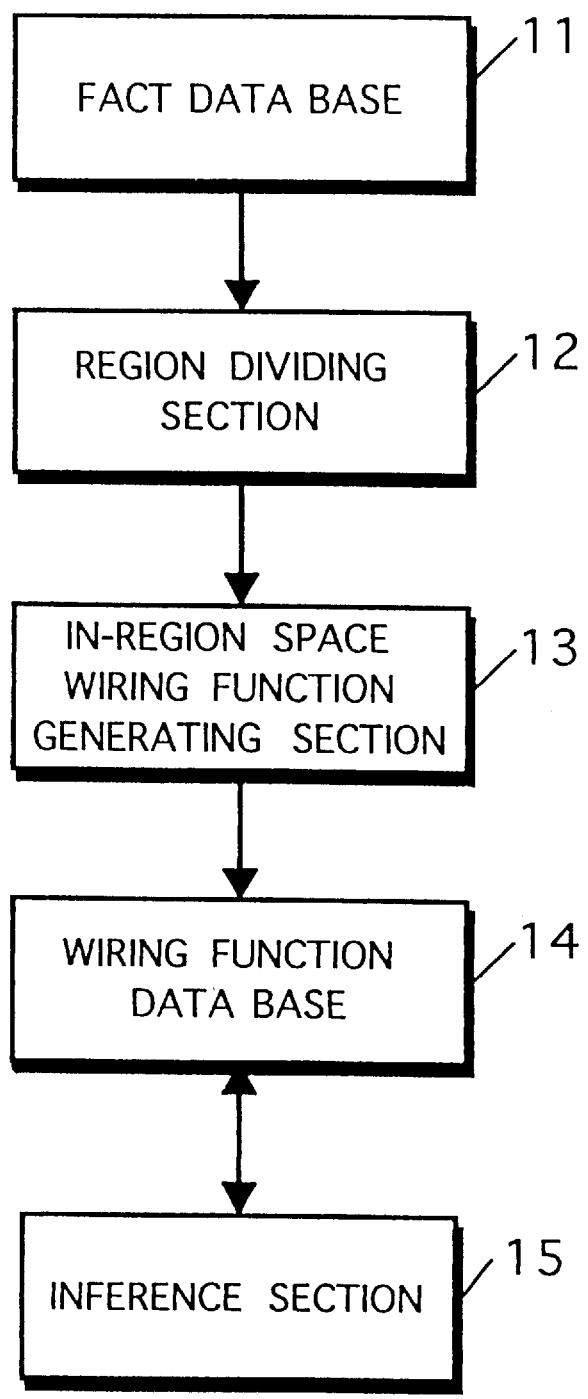
FIG. 1 is a drawing which shows the basic configuration of one embodiment of the present invention.

FIG. 1 is a block diagram which shows an outline of the functions designed to conduct initial learning as well as the inference functions of an embodiment of the present invention. The configuration includes: a fact data base 11 which stores data such as that shown in Table 1 consisting of the data group of input parameters of the observed event and the output data group which shows the results corresponding to them; a region dividing section 12 which divides, into a plurality of regions, the data representing a multidimensional curved surface which is stored in the fact data base 11; a regional space wiring function generating section 13 which generates the wiring frame for each region divided by the region dividing section 12; a wiring function data base 14 which stores the generated wiring frames as wiring functions; and an inference section 15 which executes inference using the wiring function data base 14. The wiring function is a spatial representation formula which is expressed by a group of 2-dimensional formulas established in the vicinity of a certain factual point (fact data).

Figure 2:
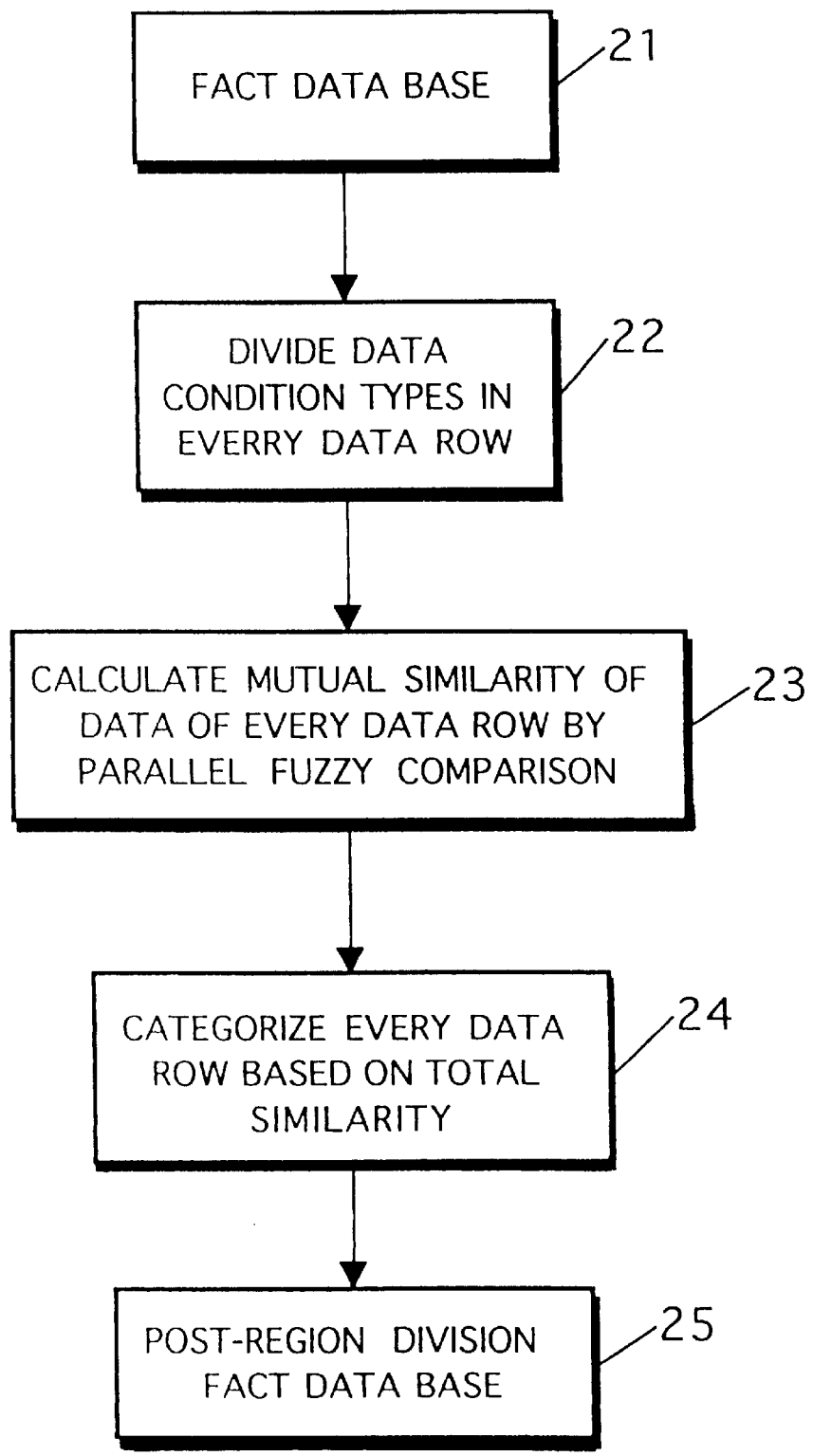
FIG. 2 is a drawing which shows the flow of region dividing processing in the present embodiment.

FIG. 2 shows one example of the dividing processing of the region dividing section 12. The region dividing method for multidimensional space is itself known (for example, refer to the chapter of Cluster Analysis in "Collection of Multivariate Analysis Cases" by Yoshizawa & Haga, published by Nikkagi Publishing Co., November 1992).

The data of a fact data base 21 is divided into condition types in each data row (step 22). The data of the fact data base 21 is expressed by the following type of hierarchic fuzzy data matrix.

$$\{\{\{I_{11}, I_{12}, \ldots, I_{1n}\}, \{O_{11}, O_{12}, \ldots, O_{1m}\}\} \quad \text{(Formula 1)}$$

$$\{\{I_{21}, I_{22}, \ldots, I_{2n}\}, \{O_{21}, O_{22}, \ldots, O_{2m}\}\}$$

$$\ldots, \ldots$$

$$\{\{I_{k1}, I_{k2}, \ldots, I_{kn}\}, \{O_{k1}, O_{k2}, \ldots, O_{km}\}\}\}$$

Here, the element I indicates the input parameters (experimental conditions), and the element O indicates the output parameters (experimental results). One row shows one experimental data, and in this case, the number of experimental data is k. One column represents the same one variable in each experimental data. Each element undergoes fuzzy representation. For example, there is the trapezoidal pattern data represented by $I_{11}$=(central value, right-hand variance, left-hand variance, right-hand certainty, left-hand certainty).

The fact data represented in the above manner is classified among several categories for each column (variable). The condition type refers to the group (type) of data which has similar values in each data column (condition), and refers to a divisional zone in each column. This zone is given a trapezoidal fuzzy representation. This zone division is set on the basis of frequency distribution. That is, there occurs division into zones which contain a certain constant established frequency. The number of zones which are formed is the number obtained by rounding up (total frequency/frequency of zone interior).

Next, the mutual similarity of the data of each data row is calculated by parallel fuzzy comparison (step 23). That is, operation is made so as to find to which condition type among those determined in step 22 each condition (column) of each data applies. This is obtained by the following formula.

Similarity=(the area of the part where each data element overlaps with each zone)/(the area of each data element)

Figure 8:
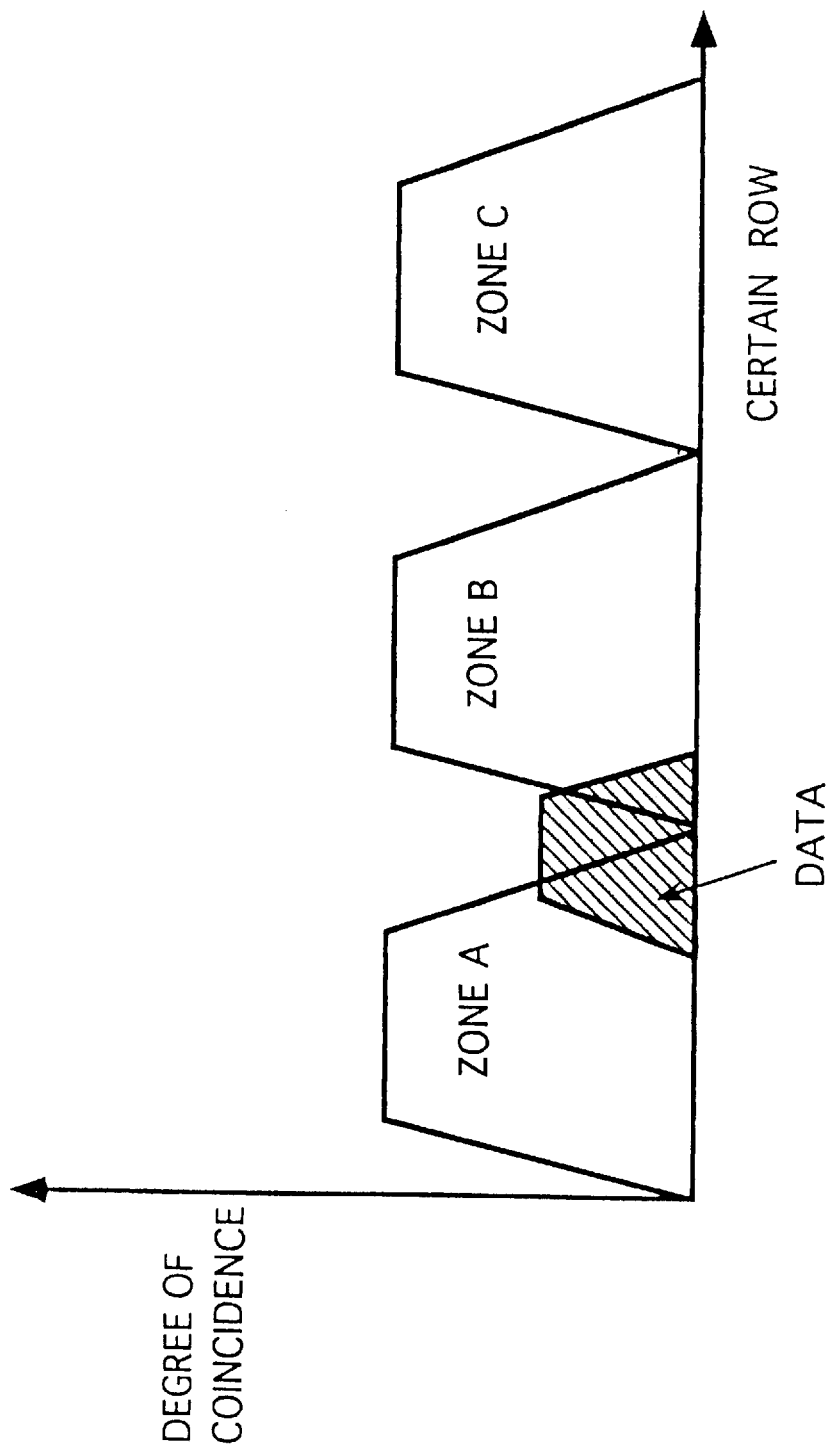
FIG. 8 is a drawing for purposes of explaining region division.

For example, in FIG. 8, since the area of the overlap of the data with zone A is greater than the overlap with zone B, the data is determined to belong to zone A.

On the basis of the similarities of each data row obtained above, the total similarity is obtained, and each data row is categorized into a plurality of regions according to this total similarity (step 24). Specifically, the total similarity is obtained by the weight mean of the similarities calculated in step 23. The result of the region division is stored in the post-region division fact data base 25.

Figure 3:
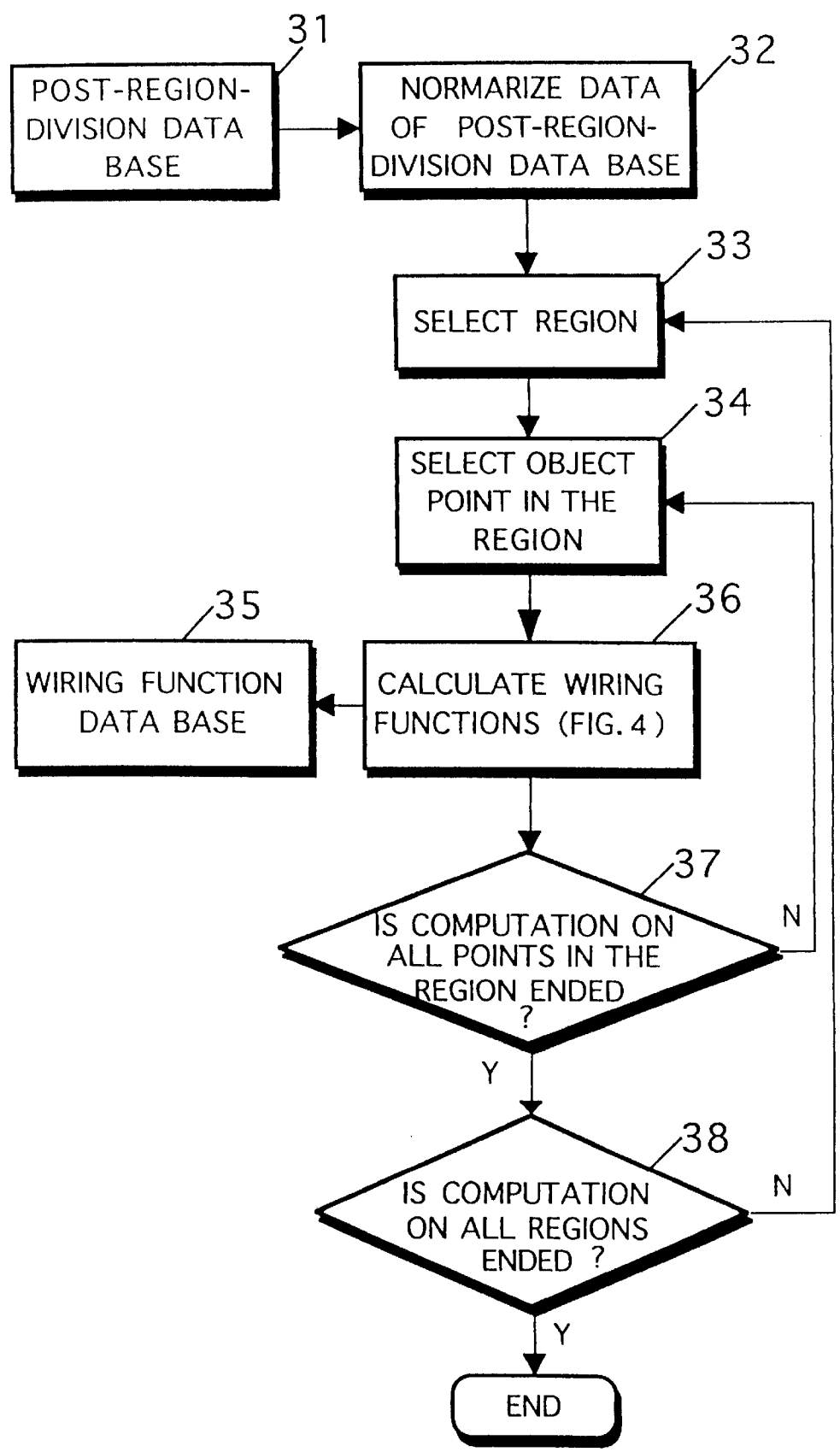
FIG. 3 is a drawing which shows the flow of the processing of regional space wiring in FIG. 2.

FIG. 3 shows the flow of processing of the regional space wiring part 13 of FIG. 1. Each data of the post-region division fact data base 25 is normalized (step 32). Moreover, one of the divisional regions is desiredly selected (step 33). Furthermore, an object point is set inside the selected region (step 34). That is, one row is selected in formula 1. The function of the wiring frame (wiring function) which transits the selected point is then computed (step 36), and the computation result is stored in the wiring function data base 36 (step 35). The operation is repeated until the computation of wiring functions for all points of the selected region has been terminated (step 37). When one region has been terminated, the next region is selected and the same processing is repeated, and the overall processing terminates when the processing of all points of all regions has ended (step 38).

Figure 4:
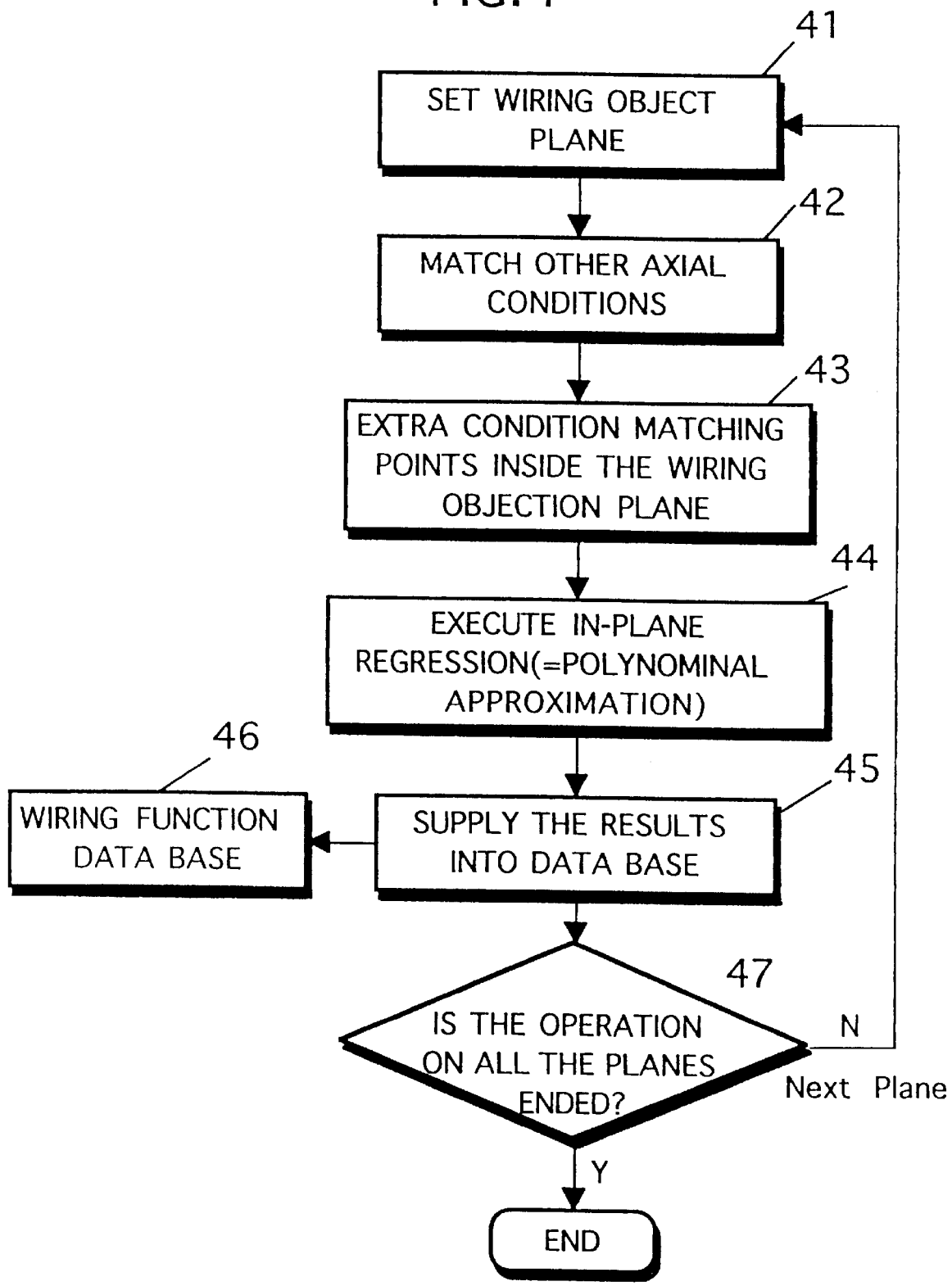
FIG. 4 is a drawing which shows the details of the computation processing of the wiring function in FIG. 3.

FIG. 4 is a drawing which shows the detailed flow of the wiring computation processing of steps 34 to 37 of FIG. 3.

First, the setting of the wiring object plane is conducted (step 41). This is an operation which selects one axis each from the input axis X and the output axis Y. The input axis X is the axis which corresponds to each column of the element I in the formula 1, and the output axis X is the axis which corresponds to each column of the element O in the formula 1. This plane passes through the object point.

Next, the matching of the other axial conditions is conducted (step 42). The details of this processing will be explained later with reference to FIG. 5.

The condition matching points inside the wiring object plane are extracted (step 43). That is, a 2-dimensional vector of the object plane is extracted from the multidimensional vector obtained by the matching of the axial conditions in step 42. The representational form of the extracted data becomes as follows.

$\{\{Iaj, Oah\}, \{Icj, Och\}, \ldots\}$

Here, the elements I and O are those mentioned above which underwent fuzzy representation.

Next, in-plane regression, that is, polynomial approximation is conducted (step 44). The in-plane regression refers to curve fitting in a 2-dimensional plane, and is identical to normal plane regression. Since the procedure of plane regression pertains to the basics of mathematics and is a matter of public knowledge, its explanation is here omitted.

The output data, which is the result of plane regression processing relative to the data extracted in step 43, is a function, and 1 function formula is obtained per 1 regression. This function formula is produced relative to one object plane. Since there is only a combination of coordinates with regard to the object plane wave and 1 object point, the output data also ultimately becomes a hierarchic functional matrix. This is a wiring function, and is expressed by the following formula.

$$\{object\ point\} \quad \text{(Formula 2)}$$

$$\{$$
$$\{\{F(I_{11}, O_{11}), \ldots, F(I_{1n}, O_{11})\}, \ldots, \{F(I_{11}, O_{1m}), \ldots,$$
$$F(I_{1n}, O_{1m})\}\}$$
$$\ldots$$
$$\{\{F(I_{k1}, O_{k1}), \ldots, F(I_{kn}, O_{k1})\}, \ldots, \{F(I_{k1}, O_{km}), \ldots,$$
$$F(I_{kn}, O_{km})\}\}$$
$$\}$$
$$\ldots$$
$$\ldots$$

Among the above expressions, element $F(I_{kn}, O_{k1})$, for example, expresses a regression formula in the plane of X axis $I_n$, Y axis $O_1$ in data k. The regression formula can take, for example, the form of the following secondary formula.

$$Y=a(X^2)+bX+c \quad \text{(Formula 3)}$$

The obtained wiring function is stored in the wiring function data base 45 (step 46). If processing has not been completed for all the wiring object planes, the identical processing is repeated with regard to the next plane (step 47).

Figure 5:
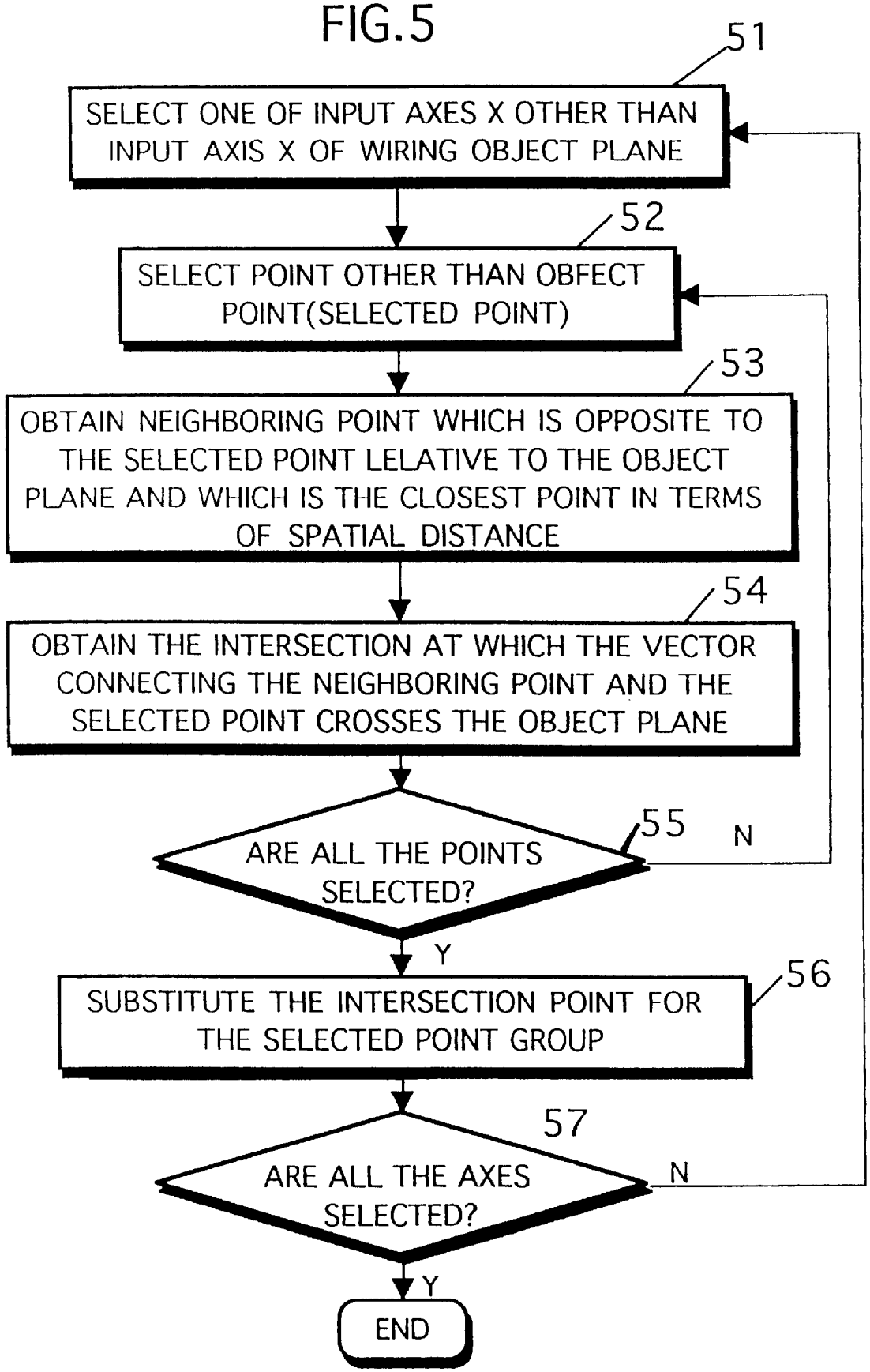
FIG. 5 is a drawing which shows the details of the matching processing of the other axial conditions in FIG. 4.

FIG. 5 shows in further detail the matching of the axial conditions of step 42 in FIG. 4.

One axis is selected from the input axes X other than the input axis Xi of the wiring object plane (step 51).

The points other than the object point are selected (step 52). These points are referred to as the selected points. Specifically, this selection is the selection of one row of the matrix of the formula 1.

The neighboring point which is opposite to the selected point relative to the object plane and which is the closest point in terms of spatial distance is obtained (step 53). The data required in order to obtain the neighboring point is the coordinate of the selected point (=one row of the matrix of formula 1) and another coordinate (=another row of the matrix of formula 1, with the exception of the row of the object point and the row of the selected point). The procedure for obtaining the neighboring point is as follows.

(1) The distance of the two points is obtained. This is only conducted with regard to the experimental input part, that is, element I, and is not conducted with regard to element O. The coordinates use the central value. The distance is obtained by the following formula.

Distance=$\sqrt{\Sigma\{(\text{selected point coordinate component coordinate-component of another point})^2\}}$ (2) Judgment is made as to whether the other point is on the opposite side of the object plane relative to the selected point or not.

For this purpose, judgment is made as to whether or not the multiplication of (the chosen axial coordinate other than the wiring object plane of the other point—the same axial coordinate of the object point) and (the same axial coordinate of the selected point—the same axial coordinate of the object point) becomes negative.

(3) Among the points which satisfy the above two conditions, the one with the shorter distance is made the neighboring point.

Figure 9:
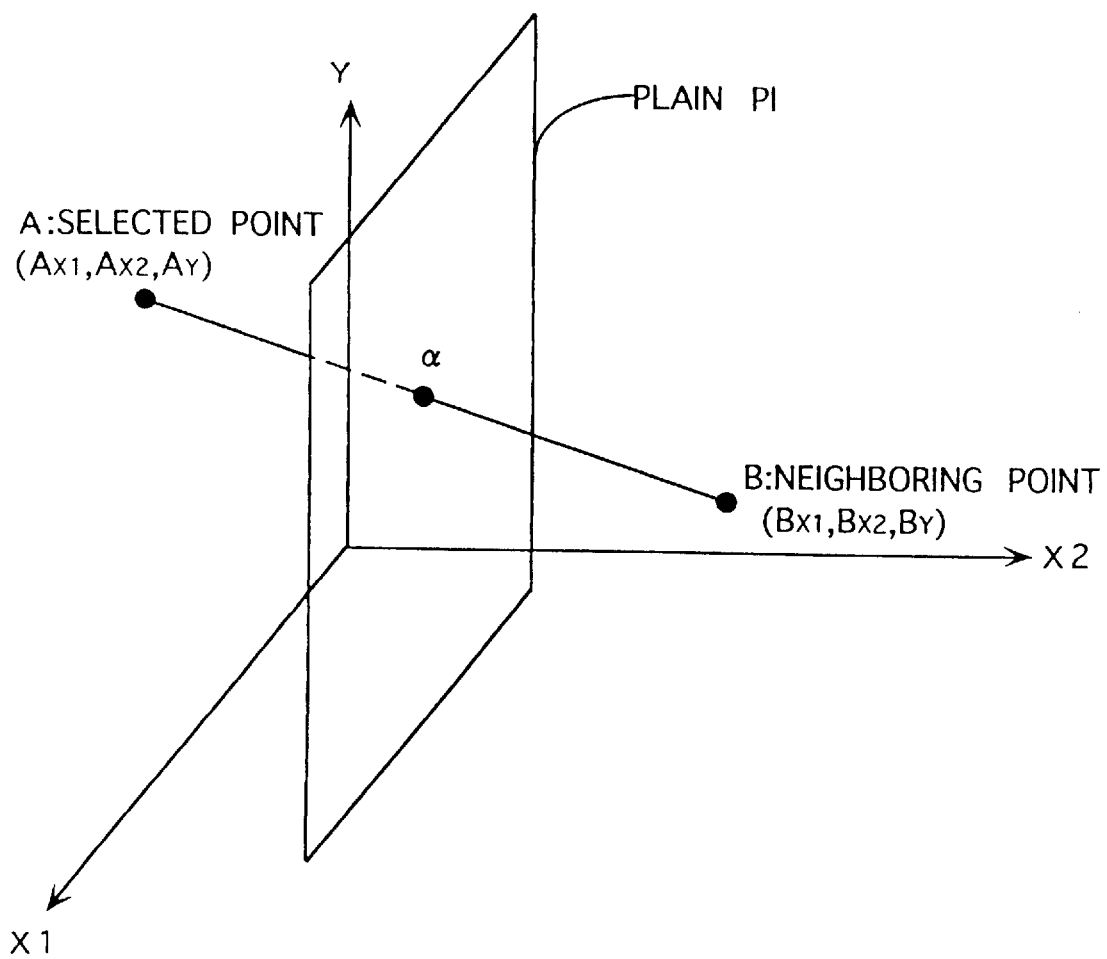
FIG. 9 is a drawing which shows the relation between the vector connecting the selected point and the neighboring point, and the object plane.
Figure 10A:
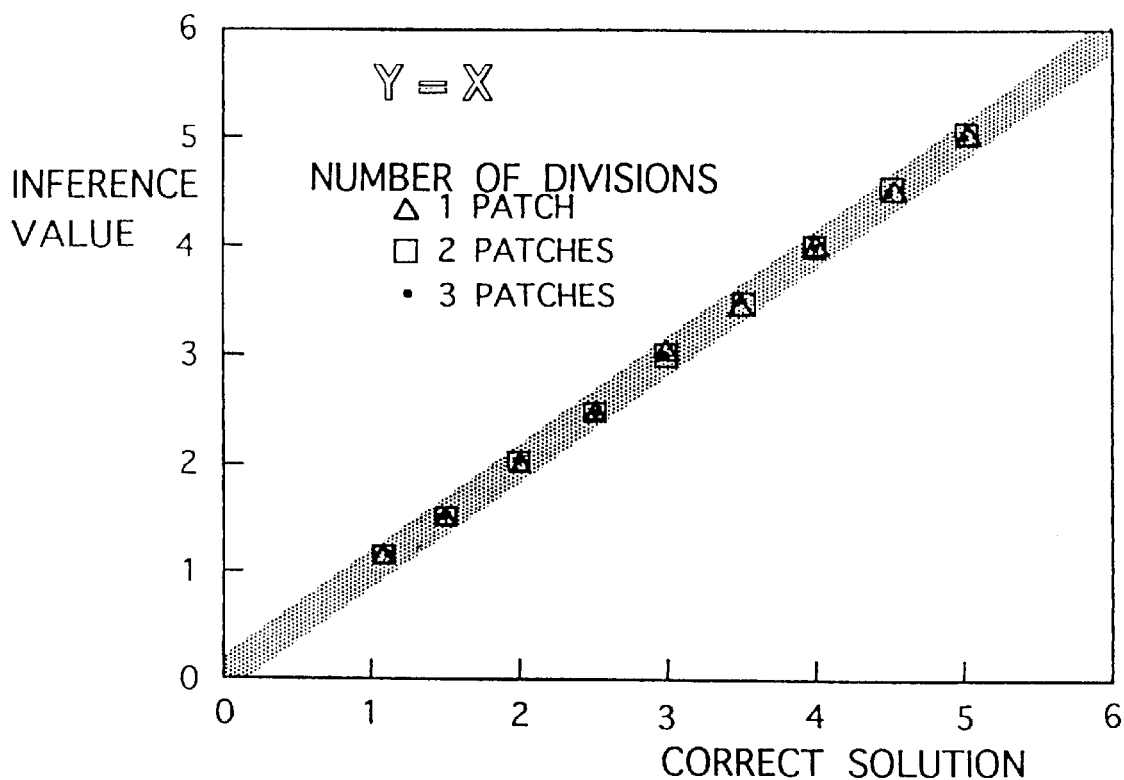
FIGS. 10A and 10B are drawings which respectively show the results of an inference test of the present embodiment with regard to the case of the linear function Y=X, and the case of the nonlinear function Y=X1*X2.
Figure 10B:
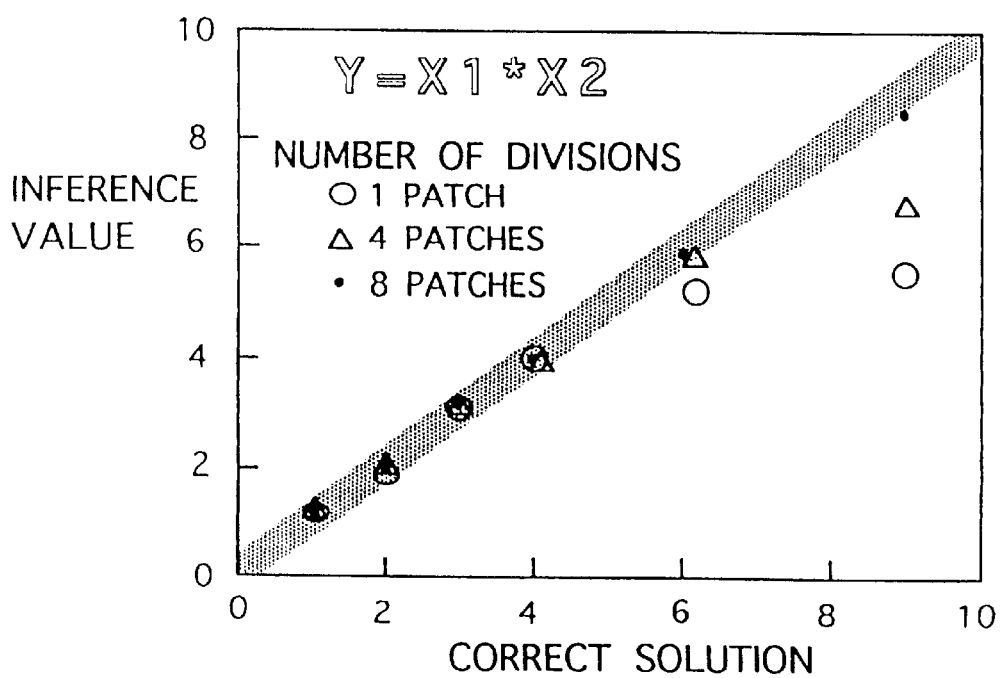

The point of intersection α at which the vector connecting the neighboring point and the selected point crosses the object plane is obtained (step 54). In FIG. 9, A is the selected point, B is the neighboring point, and the plane P1 is the object plane. The vector AB which connects these points intersects the object plane P1 at the point α. Since the object plane P1 is expressed by the formula X2=k (provided that k is a constant), in FIG. 9, for example, one obtains α=($α_{x1}$, k, $α_y$).

$α_{x1}$, and $α_y$ are obtained in the following manner. That is, the fact that Aα=|k-$A_{x2}$| and Bα=I $B_{x2}$-k| on the X2 axis; the vector AB is a line segment; and the same ratio can be established on the other component axis.

|k-$A_{x2}$|:|$B_{x2}$-k|=|$α_{x1}$-$A_{x1}$|:|$B_{x1}$-$α_{x1}$|∴$α_{x1}$={$B_{x1}$(K-$A_{x2}$)+$A_{x1}$($B_{x2}$-k)}/($B_{x2}$-$A_{x2}$)

Similarly, $α_y$ can also be obtained by using the ratio.

Based on the numbers attached to the points, judgment is made as to whether all the points have been selected (step 55). In the case where the result of this judgment proves that there are points which are not selected, the next point is selected (step 52), and the processing of steps 53 and 54 is conducted. This point selection and processing is repeated, and when the selection and processing of all points has terminated, the intersection point is substituted for the selected point group (step 56).

The point group created by the above processing constitutes the spatial points on the object plane, and constitutes the points which linearly project the axial conditions other than the object plane to the object points.

From these points, the axial components of the object plane are extracted.

Inference is executed by using the data base constructed by the above type of learning, and occurs in the following manner.

(1) From the input conditions, it is determined into which region the point to be predicted enters. The determination of this region is possible by the approximately the same processing as in steps 22 to 24 of FIG. 2.

(2) The neighboring learning data of the point to be predicted is produced by inserting the input conditions of the point to be predicted into the function matrix which is stored in the function data base 14. Next, a matching of conditions is undertaken in a manner similar to initial learning, and projection onto the point to be predicted is conducted.

(3) Plane regression is conducted based on the projection shadow of the established neighboring point.

(4) From the plane regression formula, the experimental result of the inference conditions is predicted. Since this prediction can only be made for the portion of the number of planes which are viewed from various directions relative to one experimental result, the value obtained from the arithmetical mean is considered as the prediction value.

Figure 11A:
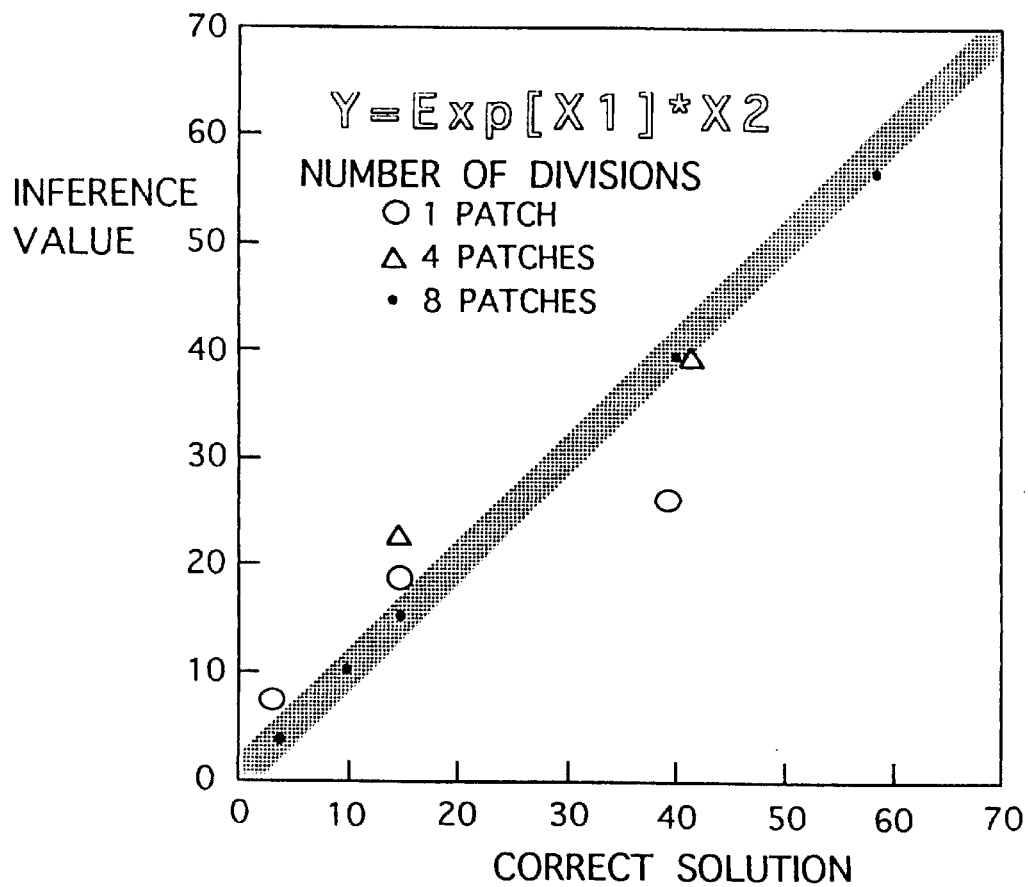
FIGS. 11A and 11B are drawings which respectively show the results of an inference test of the present embodiment with regard to the case of the nonlinear function Y=Exp[X1]*X2, and the case of the nonlinear function Y=X1*X2*X3.
Figure 11B:
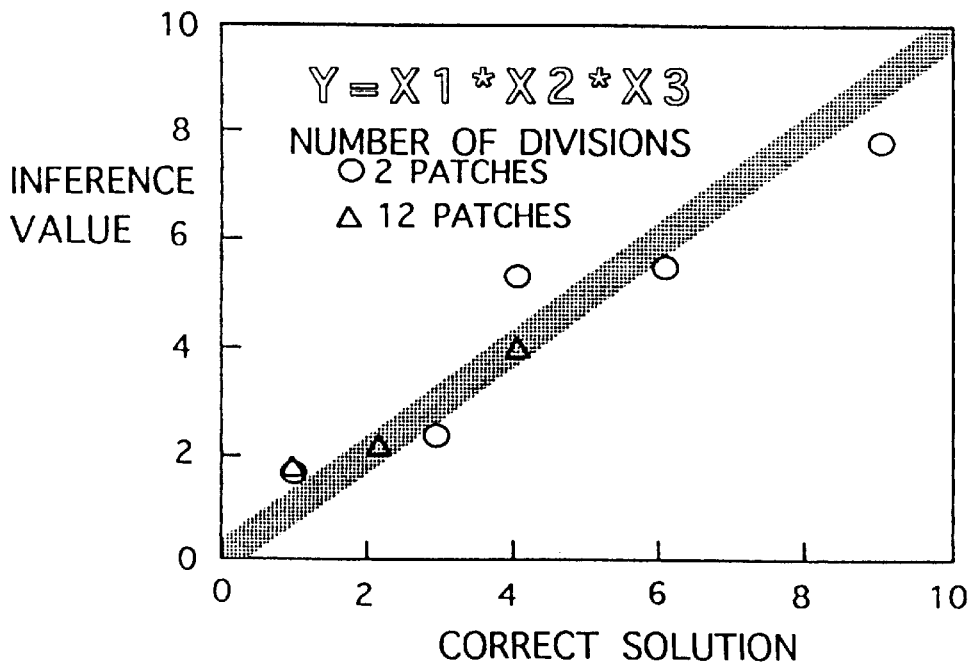

In order to evaluate the basic characteristics of the present embodiment, several functions are set, and the results of the testing of inference performance are explained. On this occasion, in addition to changing the input variables from 1 to a plurality, the influence exercised by the patch division quantity was studied. FIGS. 10A and 10B, and FIGS. 11A and 11B show examples of the results. Examples of the relation between correct values and inference values are shown with regard to a linear function in FIG. 10A, and with regard to nonlinear functions in FIG. 10B and FIG. 11A. From these drawings, it is clear that the inference attains a sufficient degree of correctness for the nonlinear functions, as well. Moreover, FIG. 11B shows test results with regard to a nonlinear function which has a plurality of inputs and outputs of more than 3 dimensions, and a sufficient degree of correctness is obtained even with regard to this function.

From these results, it is clear that the present embodiment is capable of learning complex input-output relations with a small number of learning points.

Figure 12A:
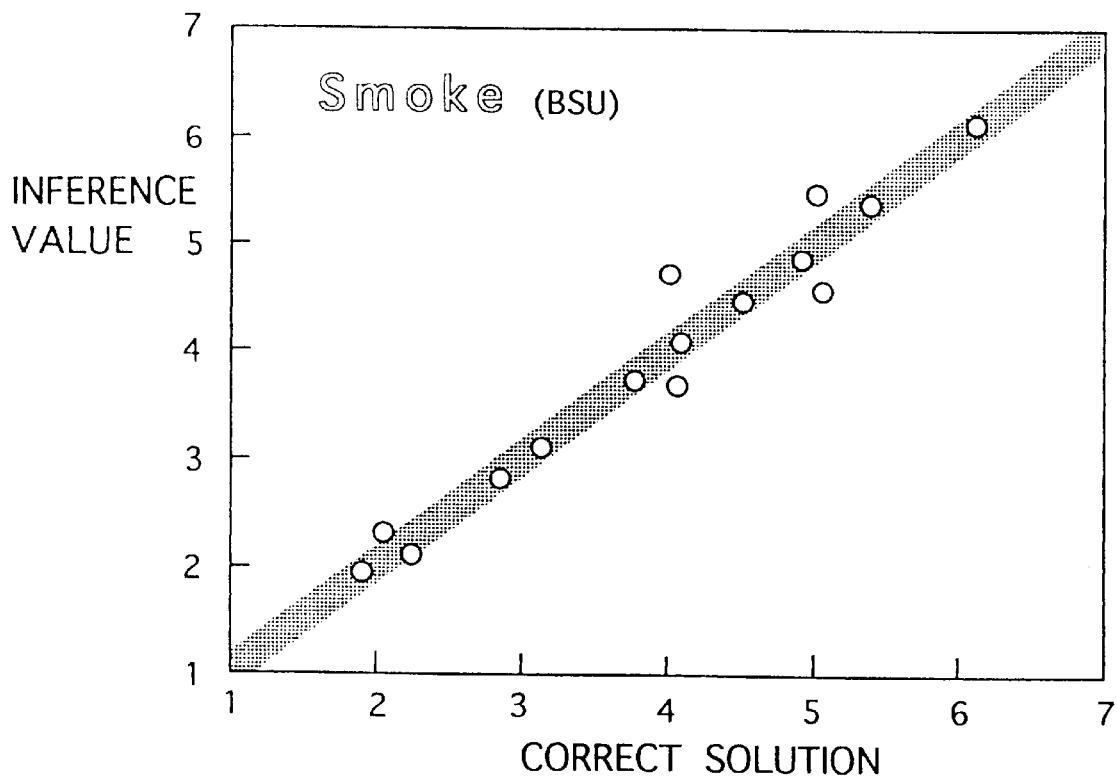
FIG. 12A is a drawing which shows the results of an inference test for exhaust smoke concentration applying engine performance data to the present invention.
Figure 12B:
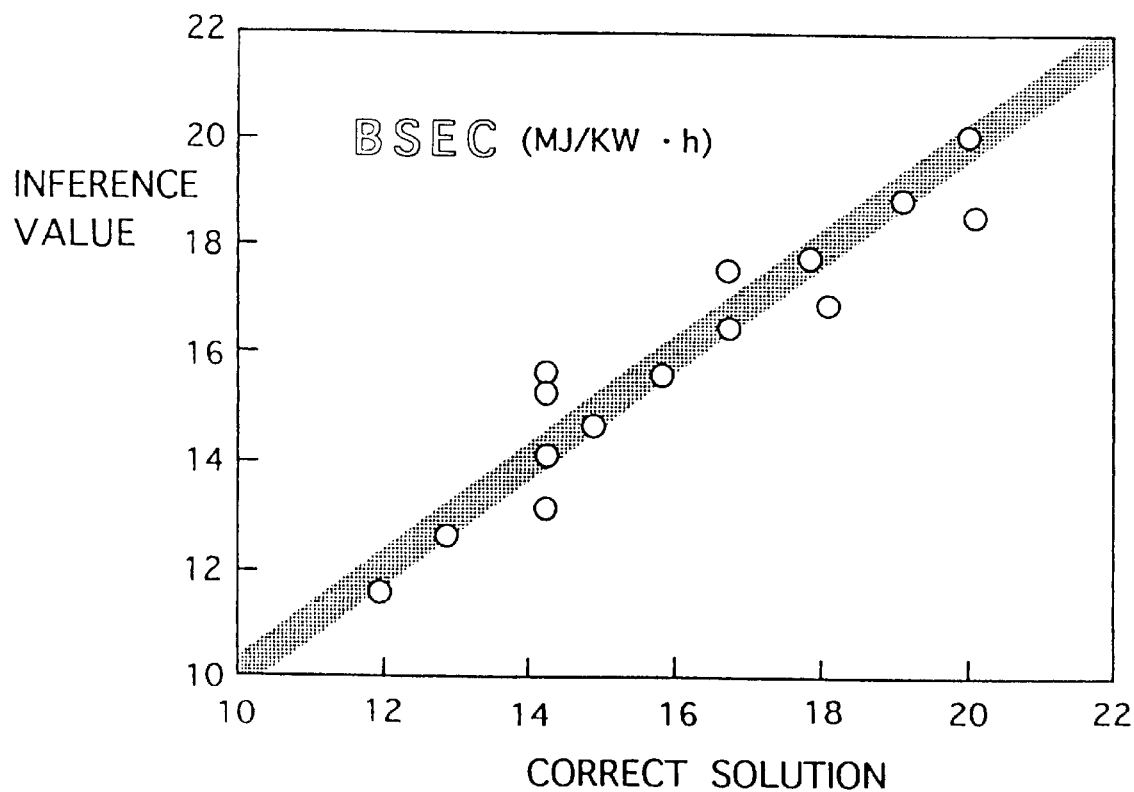
FIG. 12B is a drawing which shows the results of an inference test for the fuel consumption rate when engine performance data is applied to the present invention.
Figure 13A:
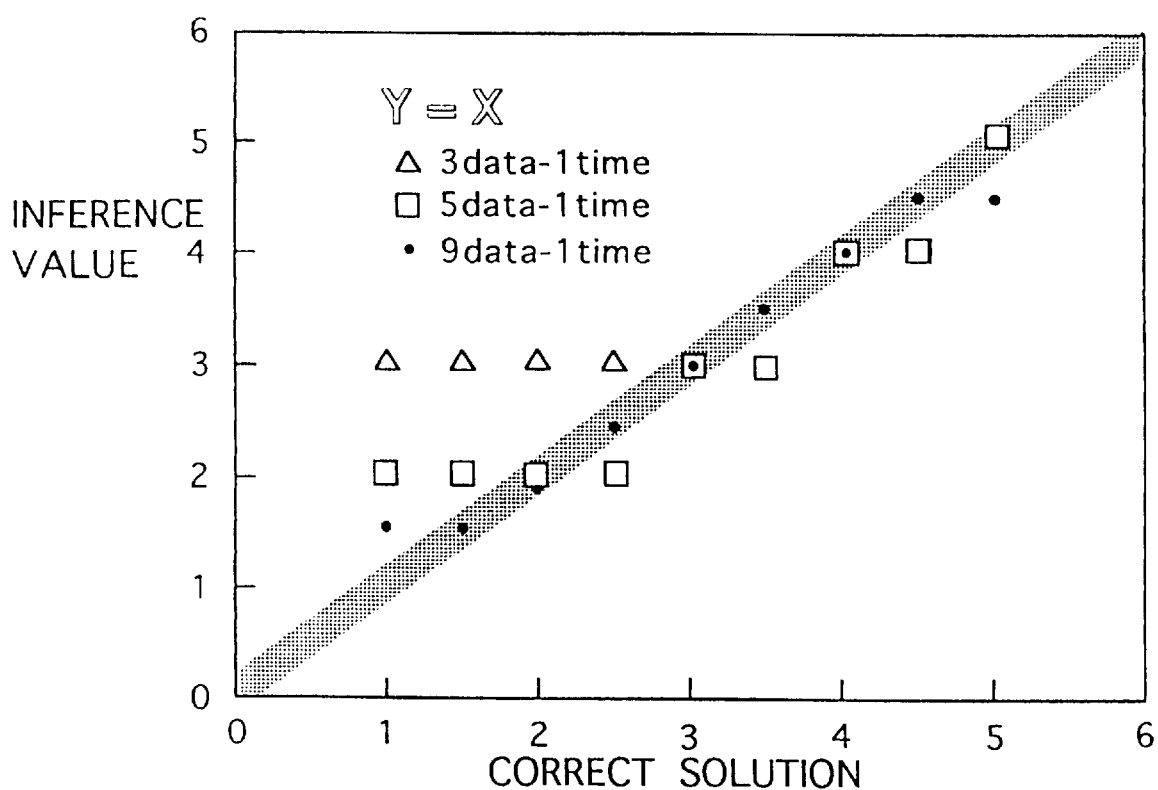
FIGS. 13A and 13B are drawings which respectively show the test results for inference by the conventional fuzzy neural network with regard to the case of the linear function Y=X, and the case of the nonlinear function Y=X1*X2.
Figure 13B:
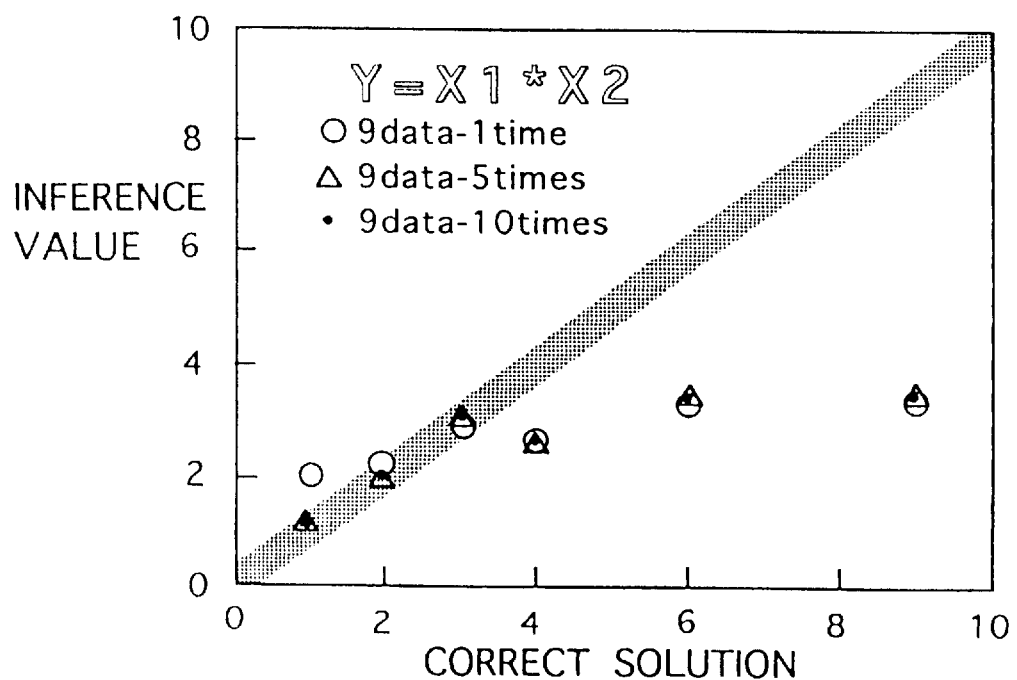
Figure 14A:
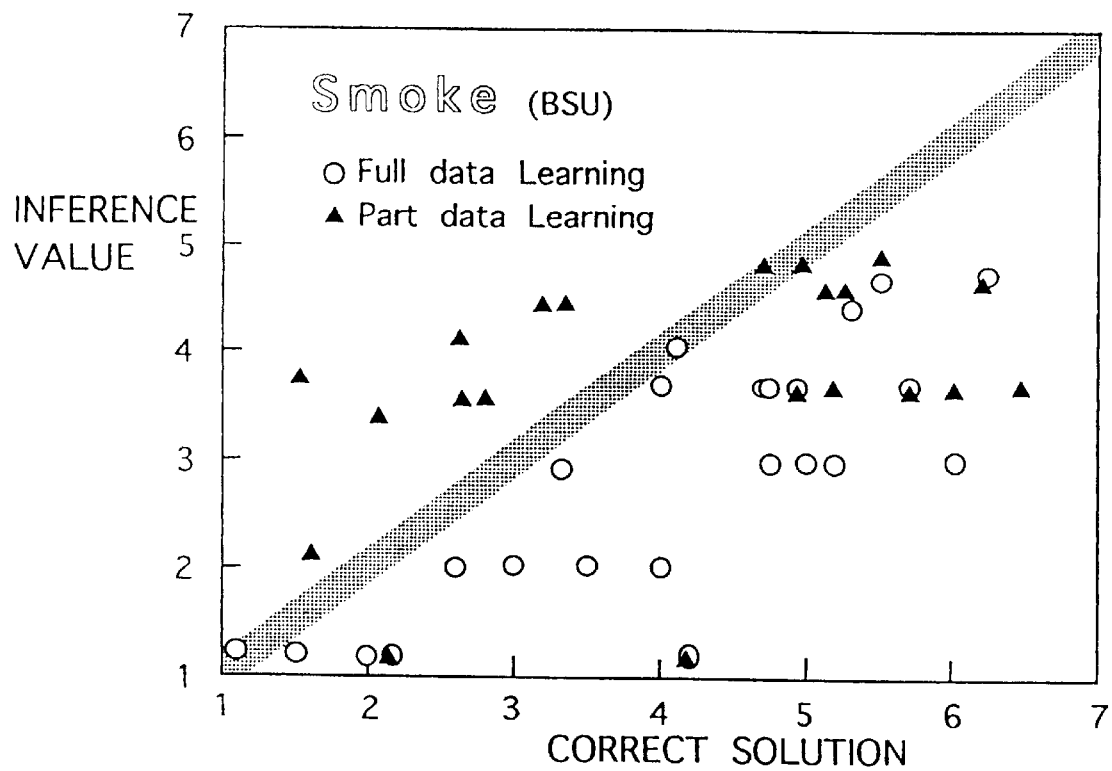
FIG. 14A shows the results of an inference test for exhaust smoke concentration in engine performance by the conventional technology.
Figure 14B:
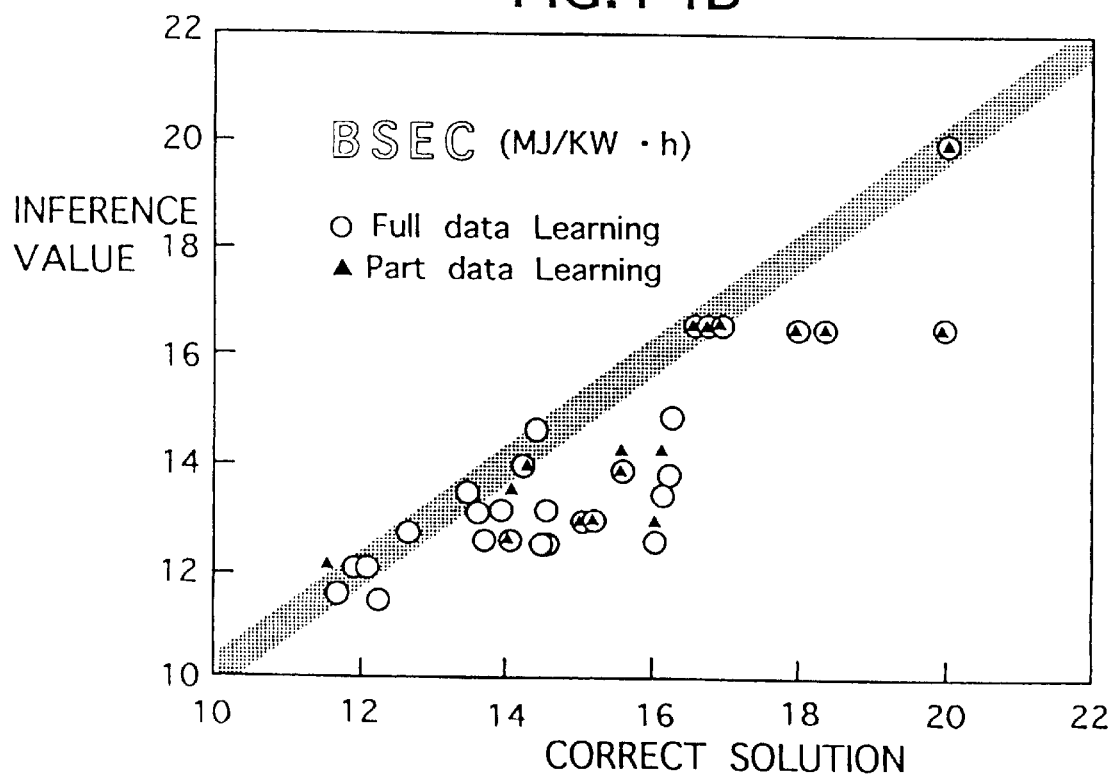
FIG. 14B shows the results of an inference test for the fuel consumption rate.

Next, in order to study a practical application, an experiment was performed wherein part of the same engine performance data used to explain the conventional technology in FIGS. 14A and 14B was learned by the artificial intelligence system of the present embodiment, and inference of the learned points and the remaining measured data was conducted. FIGS. 12A and 12B are the inference results for the fuel consumption rate and the exhaust smoke concentration; the correct values are on the horizontal axis and the inference values are on the vertical axis. As shown in the drawings, compared to the results of FIGS. 14A and 14B using the conventional fuzzy neural network, there is clearly a large-scale improvement in inference results with the embodiment of the present invention. Accordingly, even with regard to engine performance which has nonlinear and complex relations, it is possible to obtain good inference results with a small amount of learning data.

As explained above, according to the present invention, since phenomena having nonlinear relations composed from multivariates can be suitably analyzed and represented even with a small quantity of data by the introduction of wiring functions, it is possible to construct a data base for use in inference based on a small amount of learning data. Moreover, according to the present invention, it is possible to rapidly conduct highly accurate inference in comparison to the conventional artificial intelligence.

We claim:

1. A learning/inference method for artificial intelligence implemented on a computer for analyzing physical cause and effect relation of phenomena represented by nonlinear multidimensional space, comprising:

a first step of deriving fact data which consists of a data group of input parameters of an observed event and a data group of output parameters of said observed event;

a second step of dividing a multidimensional curved surface constituted by fact data into a plurality of regions;

a third step of generating wiring functions of the respective divisional regions, and storing the wiring functions as a knowledge base; and a fourth step of executing interference by conducting position prediction computation of a space interior using the stored wiring functions, wherein said data group of input parameters includes driving condition parameters detected by at least one sensor in an automotive internal combustion engine.

2. The learning/inference method recited in claim 1, wherein said data group of output parameters includes fuel injection system parameters and combustion chamber shape for said automotive internal combustion engines.

3. The learning/inference method recited in claim 2, wherein said fuel injection system parameters include swirl ratio and number of fuel injection nozzle holes.

4. The learning/inference method recited in claim 1, wherein said space interior includes values for at least one of a rate of fuel combustion, exhaust smoke generation amount, NOx generation amount, and maximum value of heat generation amount for said automotive internal combustion engine.

5. The learning/inference method recited in claim 1, wherein said driving condition parameters include engine rotational speed and net brake mean effective pressure.

6. A learning/inference apparatus for artificial intelligence implemented on a computer for analyzing physical cause and effect relation of phenomena represented by nonlinear multidimensional space, comprising:

- a fact data storage means for storing fact data which consists of a data group of input parameters of an observed event and a data group of output parameters of said observed event;
- a region dividing means for dividing, into a plurality of regions, a multidimensional curved surface composed by the data stored in said fact data storage means;
- a regional space wiring function generating means for generating wiring functions of the respective divisional regions divided by said region dividing means;
- a wiring function data base for storing the generated wiring functions as a knowledge base; and
- an inference means for conducting in-space position prediction computation by using the stored wiring function data base,
- wherein said group of input parameters includes driving condition parameters detected by at least one sensor in an automotive internal combustion engine.

7. The learning/inference apparatus recited in claim 6, wherein the data group of output parameters include fuel injection system parameters and combustion chamber shape for said automotive internal combustion engines.

8. The learning/inference apparatus recited in claim 7, wherein said fuel injection system parameters include swirl ratio and number of fuel injection nozzle holes.

9. The learning/inference method recited in claim 6, wherein said space interior includes values for at least one of a rate of fuel combustion, exhaust smoke generation amount, no generation amount, and maximum value of heat generation amount for said automotive internal combustion engine.

10. The learning/inference apparatus recited in claim 6, wherein said detected driving condition parameters include engine rotational speed and net brake mean effective pressure.

* * * * *